US012740091B2

(12) United States Patent
Su et al.

(10) Patent No.: US 12,740,091 B2
(45) Date of Patent: Sep. 15, 2026

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Bo Su, Shanghai (CN); Hansu Oh, Shanghai (CN); Chunsheng Zheng, Shanghai (CN); Erhu Zheng, Shanghai (CN); Haiyang Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 571 days.

(21) Appl. No.: 18/124,058

(22) Filed: Mar. 21, 2023

(65) Prior Publication Data

US 2023/0223452 A1 Jul. 13, 2023

Related U.S. Application Data

(63) Continuation of application No. PCT/CN2020/117829, filed on Sep. 25, 2020.

(51) Int. Cl.
*H10D 30/62* (2025.01)
*H10D 30/01* (2025.01)
(Continued)

(52) U.S. Cl.
CPC ....... *H10D 30/6219* (2025.01); *H10D 30/024* (2025.01); *H10D 30/6211* (2025.01);
(Continued)

(58) Field of Classification Search
None
See application file for complete search history.

(56) References Cited

U.S. PATENT DOCUMENTS 8,569,810 B2 10/2013 Yu et al.
2004/0033678 A1* 2/2004 Arghavani ........ H01L 21/28176 438/510

(Continued)

FOREIGN PATENT DOCUMENTS

| | | |
|---|---|---|
| CN | 102117808 | 7/2011 |
| CN | 105097534 | 11/2015 |
| CN | 105225950 | 1/2016 |

OTHER PUBLICATIONS

International Search Report issued Feb. 25, 2021 in International (PCT) Application No. PCT/CN2020/117829.

*Primary Examiner* — Steven B Gauthier
*Assistant Examiner* — Lamont B Koo
(74) *Attorney, Agent, or Firm* — Crowell & Moring LLP

(57) ABSTRACT

A semiconductor structure and a forming method thereof are provided. The method includes: providing a substrate, a dummy spacer being formed on a side wall of the gate structure, a contact etch stop layer being formed on a side wall of the dummy spacer, and a source/drain doped area being formed in the substrate on two sides of the gate structure; forming a sacrificial dielectric layer above tops of the source/drain doped area and the gate structure; forming a source/drain plug running through the sacrificial dielectric layer; etching the sacrificial dielectric layer until a top of the dummy spacer is exposed; removing, after the top of the dummy spacer is exposed, the dummy spacer to form a gap between the contact etch stop layer and the side wall of the gate structure; and forming a top dielectric layer filling between the source/drain plugs.

9 Claims, 5 Drawing Sheets

(51) Int. Cl.
*H10D 64/01* (2025.01)
*H10D 84/01* (2025.01)
*H10D 84/03* (2025.01)
*H10D 84/85* (2025.01)

(52) U.S. Cl.
CPC ......... *H10D 64/017* (2025.01); *H10D 84/017* (2025.01); *H10D 84/0184* (2025.01); *H10D 84/038* (2025.01); *H10D 84/853* (2025.01)

(56) References Cited

U.S. PATENT DOCUMENTS

2019/0148151 A1* 5/2019 Okuno ................. H10D 64/667
257/401
2019/0148501 A1* 5/2019 Chen .................... H10D 64/665
2020/0235094 A1* 7/2020 Bergendahl ........ H10D 84/0158
2021/0098469 A1* 4/2021 Yang .................. H10D 84/0193

* cited by examiner

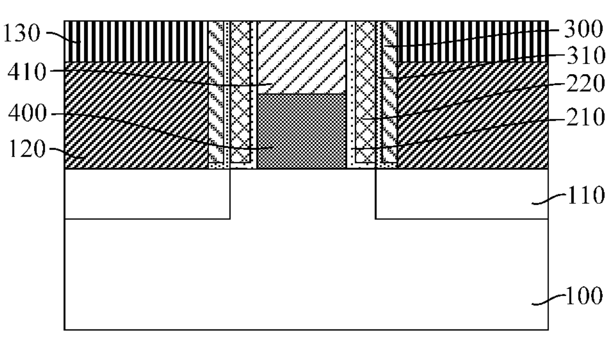
FIG. 11
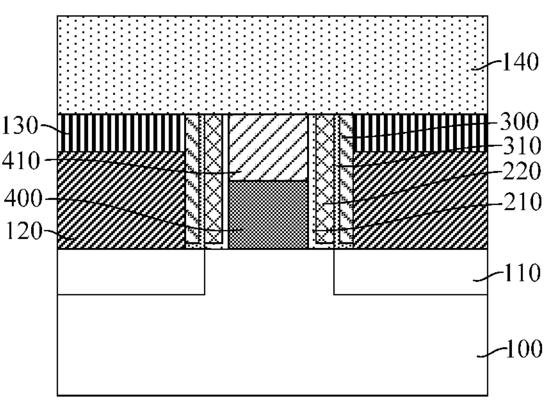
FIG. 12
FIG. 13

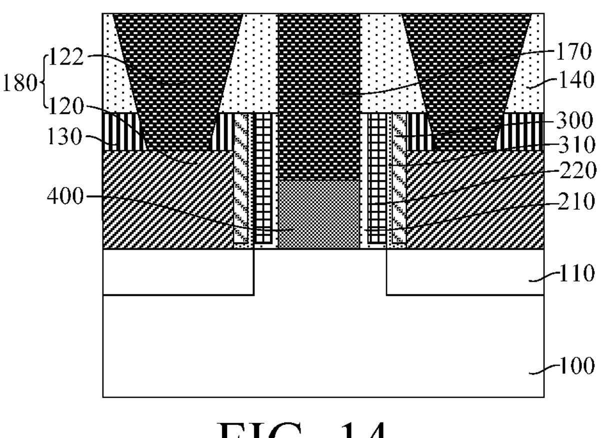
FIG. 14
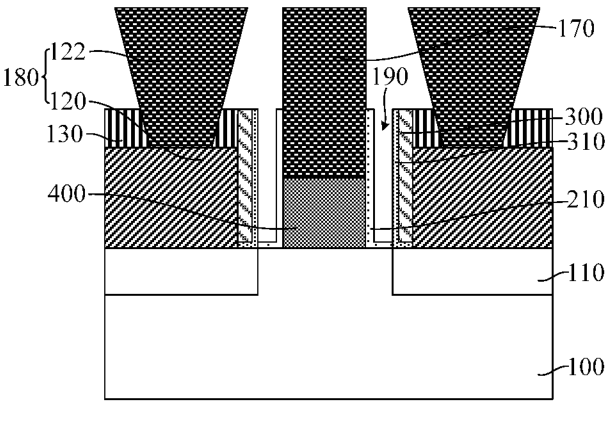
FIG. 15
180
122
120
130
210
400
170
500
300
310
510
110
100
FIG. 16

SEMICONDUCTOR STRUCTURE AND FORMING METHOD THEREOF

CROSS REFERENCE TO RELATED APPLICATIONS

This application is a continuation application of PCT Patent Application No. PCT/CN2020/117829, filed on Sep. 25, 2020, the entire content of which is incorporated herein by reference.

TECHNICAL FIELD

The disclosure relates to the field of semiconductor manufacturing, and in particular to a semiconductor structure and a forming method thereof.

BACKGROUND

With the continuous development of integrated circuit manufacturing technology, the requirements for integrated level and performance of integrated circuits have become higher and higher. In order to improve the integrated level and reduce the cost, the critical dimensions of components are getting smaller, and the circuit density inside integrated circuits are getting higher. This development makes it impossible for the wafer surface to provide enough area to make the required lines.

In order to meet the requirements of the lines after the critical dimensions are reduced, at present, the conduction between different metal layers or between a metal layer and a substrate is realized through an interconnect structure. The interconnect structure includes a line and a contact plug formed in a contact opening. The contact plug is connected to the semiconductor device, and the line realizes the connection between the contact plugs, thereby forming the circuit.

The contact plug in a transistor structure includes a gate contact plug located on the surface of the gate structure and used to realize the connection between the gate structure and an external circuit, and further includes a source/drain contact plug located on the surface of the source/drain doped area and used to realize the connection between the source/drain doped area and the external circuit.

SUMMARY the disclosure relates to a semiconductor structure and a forming method thereof to improve the performance of the semiconductor structure.

In an aspect of the disclosure, a forming method of a semiconductor structure is provided. The method may include:

providing a substrate, a gate structure being formed on the substrate, a dummy spacer being formed on a side wall of the gate structure, a contact etch stop layer being formed on a side wall of the dummy spacer, and a source/drain doped area being formed in the substrate on two sides of the gate structure; forming a sacrificial dielectric layer above tops of the source/drain doped area and the gate structure; forming a source/drain plug running through the sacrificial dielectric layer above the top of the source/drain doped area and contacting the source/drain doped area; etching, after the source/drain plug is formed, the sacrificial dielectric layer until a top of the dummy spacer is exposed; removing, after the top of the dummy spacer is exposed, the dummy spacer to form a gap between the contact etch stop layer and the side wall of the gate structure; and forming a top dielectric layer filling between the source/drain plugs, the top dielectric layer further filling the gap to form a spacer in the gap, or the top dielectric layer sealing a top of the gap to form an air gap, and a dielectric constant of a material of the top dielectric layer being less than a dielectric constant of a material of the dummy spacer.

In another aspect of the disclosure, a semiconductor structure is provided. The semiconductor structure may include:

a substrate; a gate structure, located on the substrate; a source/drain doped area, located in the substrate on two sides of the gate structure; a contact etch stop layer, located on the substrate between the source/drain doped area and the gate structure and arranged opposite to a side wall of the gate structure, a gap being provided between the contact etch stop layer and the side wall of the gate structure; a source/drain plug, located at a top of the source/drain doped area and contacting the source/drain doped area; and a top dielectric layer, filling between the source/drain plugs, the top dielectric layer further filling the gap and the top dielectric layer filling the gap serving as a spacer, or the top dielectric layer sealing a top of the gap to form an air gap, and a material of the top dielectric layer being a low k dielectric material or an ultra-low k dielectric material.

Compared with the prior art, the disclosure have the following advantages: In the forming method provided by the example of the disclosure, the dummy spacer located on the side wall of the gate structure is formed, and the sacrificial dielectric layer and the source/drain plug running through the sacrificial dielectric layer above the top of the source/drain doped area and contacting the source/drain doped area are formed above the tops of the source/drain doped area and the gate structure; after the source/drain plug is formed, the sacrificial dielectric layer is etched until the top of the dummy spacer is exposed, and the dummy spacer is removed to form the gap between the contact etch stop layer and the side wall of the gate structure; and then, the top dielectric layer filling between the source/drain plugs is formed. The top dielectric layer further fills the gap to form the spacer in the gap, or seals the top of the gap to form the air gap. The dielectric constant of the material of the top dielectric layer is less than the dielectric constant of the material of the dummy spacer. By removing the dummy spacer and forming the top dielectric layer whose material has a lower dielectric constant, the spacer whose material has a lower dielectric constant or the air gap is formed, so that the effective capacitance between the gate structure and the source/drain plug is reduced, thereby improving the performance of the semiconductor structure. Moreover, the dummy spacer is removed subsequently, so the material of the dummy spacer can be selected flexibly. This makes the material of the dummy spacer compatible with the subsequent process, and accordingly, is beneficial to improving the performance of the semiconductor structure.

BRIEF DESCRIPTION OF THE DRAWINGS

FIG. 5 to FIG. 16 are schematic structural diagrams corresponding to steps in an example of a forming method of a semiconductor structure according to the disclosure.

DETAILED DESCRIPTION

At present, the performance of semiconductor structure needs to be improved. The reasons why the performance of the semiconductor structure needs to be improved will be analyzed in conjunction with a forming method of a semiconductor structure.

FIG. 1 to FIG. 4 are schematic structural diagrams corresponding to steps in a forming method of a semiconductor structure.

Figure 1:
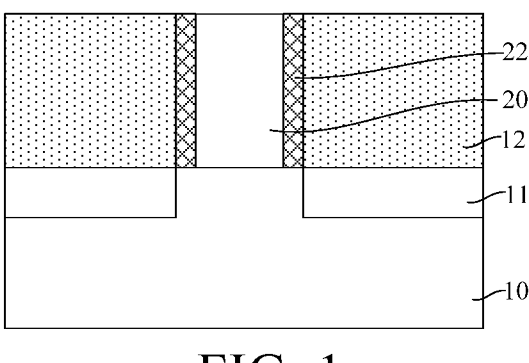
FIG. 1 to FIG. 4 are schematic structural diagrams corresponding to steps in a forming method of a semiconductor structure.

Referring to FIG. 1, a substrate 10 is provided. A dummy gate 20 is formed on the substrate 10. A spacer 22 is formed on a side wall of the dummy gate 20. A source/drain doped area 11 is formed in the substrate 10 on two sides of the dummy gate 20. A bottom dielectric layer 12 covering the source/drain doped area 11 is formed on the substrate 10 at a side of the dummy gate 20.

Figure 2:
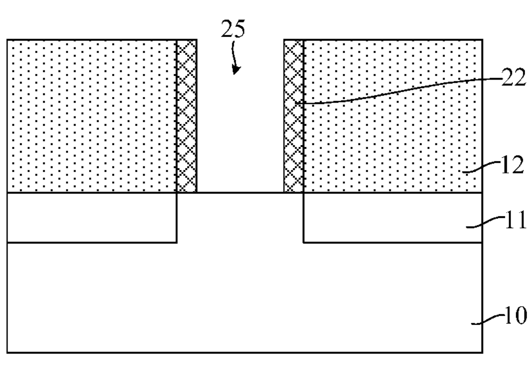

Referring to FIG. 2, the dummy gate 20 is removed to form a gate opening 25 in the bottom dielectric layer 12.

Figure 3:
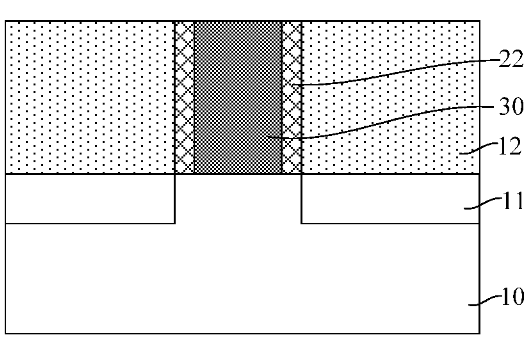

Referring to FIG. 3, a gate structure 30 is formed in the gate opening 25 (as shown in FIG. 2).

Figure 4:
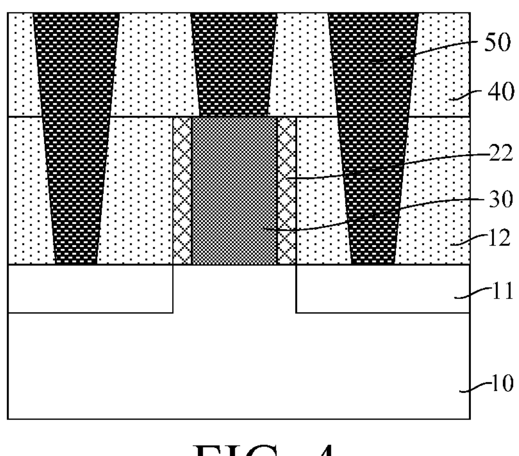

Referring to FIG. 4, a top dielectric layer 40 is formed on tops of the source/drain doped area 11 and the gate structure 30. A source/drain plug 50 running through the top dielectric layer 40 and the bottom dielectric layer 12 above a top of the source/drain doped area 11 and contacting the source/drain doped area 11 is formed.

During the formation of the semiconductor structure, the step of forming the source/drain doped area 11 typically includes: using the spacer 22 as a mask, the substrate 10 on the two sides of the dummy gate 20 is etched to form a groove (not shown) in the substrate 10; the groove is pre-cleaned; and after the pre-cleaning, an epitaxial layer is formed in the groove, during the formation of the epitaxial layer, ions are autodoped in situ, and the ion-doped epitaxial layer serves as the source/drain doped area 11. In order to reduce the damage to the spacer 22 by the pre-cleaning, the spacer 22 has high hardness and density, which makes the spacer 22 have high etching resistance. Moreover, a process of removing the dummy gate 20 typically includes wet etching. Similarly, in order to reduce the probability of damage to the spacer 22 during the removal of the dummy gate 20, the etching resistance of the spacer 22 is also required. Therefore, during the formation of the current semiconductor structure, a material of the spacer 22 typically has a high dielectric constant (for example, the material of the spacer 22 is silicon nitride), resulting in a large effective capacitance between the gate structure 30 and the source/drain plug 50.

To address the technical problems, an example of the disclosure provides a forming method of a semiconductor structure, including: a contact etch stop layer is formed on a side wall of a dummy spacer, and a source/drain doped area is formed in a substrate on two sides of the gate structure; a sacrificial dielectric layer above tops of the source/drain doped area and the gate structure is formed; a source/drain plug running through the sacrificial dielectric layer above the top of the source/drain doped area and contacting the source/drain doped area is formed; after the source/drain plug is formed, the sacrificial dielectric layer is etched until a top of the dummy spacer is exposed; after the top of the dummy spacer is exposed, the dummy spacer is removed to form a gap between the contact etch stop layer and the side wall of the gate structure; and a top dielectric layer filling between the source/drain plugs is formed, the top dielectric layer further fills the gap to form a spacer in the gap, or the top dielectric layer seals a top of the gap to form an air gap, and a dielectric constant of a material of the top dielectric layer is less than a dielectric constant of a material of the dummy spacer.

In the forming method provided by the example of the disclosure, by removing the dummy spacer and forming the top dielectric layer whose material has a lower dielectric constant, the spacer whose material has a lower dielectric constant or the air gap is formed, so that the effective capacitance between the gate structure and the source/drain plug is reduced, thereby improving the performance of the semiconductor structure. Moreover, the dummy spacer is removed subsequently, so the material of the dummy spacer can be selected flexibly. This makes the material of the dummy spacer compatible with the subsequent process, and accordingly, is beneficial to improving the performance of the semiconductor structure.

To make the foregoing objectives, features, and advantages of the examples of the disclosure more apparent and easier to understand, specific examples of the disclosure are described in detail below with reference to the accompanying drawings.

FIG. 5 to FIG. 16 are schematic structural diagrams corresponding to steps in an example of a forming method of a semiconductor structure according to the disclosure.

Referring to FIG. 5 to FIG. 10, a substrate 100 is provided. A gate structure 400 is formed on the substrate 100. A dummy spacer 220 is formed on a side wall of the gate structure 400. A contact etch stop layer 300 is formed on a side wall of the dummy spacer 220. A source/drain doped area 110 is formed in the substrate 100 on two sides of the gate structure 400.

The substrate 100 provides a process platform for the subsequent process. In this example, taking the case where the substrate 100 is used for forming a planar field-effect transistor as an example, the substrate 100 is a planar base. In other examples, the substrate is used for forming a fin field-effect transistor (FinFET), and accordingly, the substrate includes a base and a fin protruding from the base.

In this example, the substrate 100 is a silicon base. In some other examples, the substrate may alternatively be a base of another type of material. For example, the material of the substrate may be another material such as germanium, silicon-germanium, silicon carbide, gallium arsenide and indium-gallium. The substrate may alternatively be another type of base such as a silicon on insulator base and a germanium on insulator base.

Figure 5:
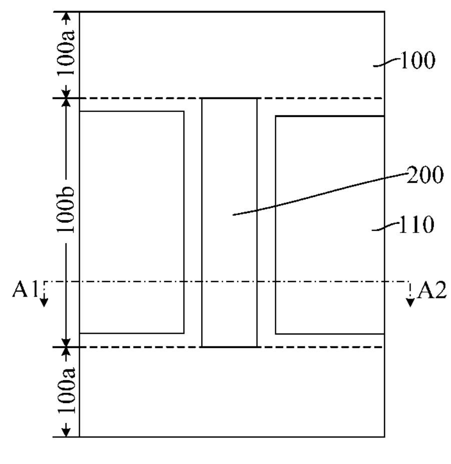

As shown in FIG. 5, FIG. 5 is a top view. In this example, the substrate 100 includes a device area **100*b* and an isolation area 100*a*. The device area 100*b* is used for forming a transistor. An area other than the device area 100*b* is the isolation area 100*a*. In this example, the device area 100*b* is an active area (AA). Subsequently, a contact over active gate (COAG) is formed on a top of the gate structure 400** in the active area, thereby saving the area of the chip.

In this example, the gate structure 400 is formed by a high k last metal gate last process. Therefore, referring to FIG. 5 and FIG. 6, before the gate structure 400 is formed, the forming method further includes: a dummy gate 200 is formed on the substrate 100.

Figure 6:
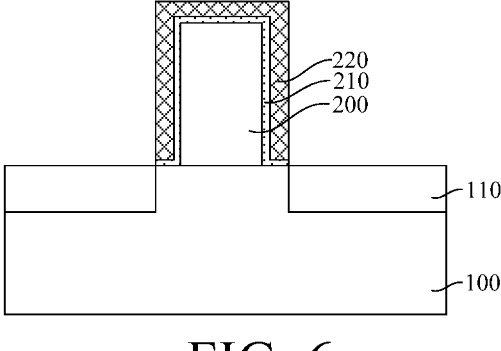

FIG. 5 is a top view, and for the convenience of illustration, only the substrate 100, the dummy gate 200 and the source/drain doped area 110 are shown. FIG. 6 is a sectional view of FIG. 5 taken along line A1A2. Specifically, the dummy gate 200 is formed on the substrate 100 in the device area **100*b*. The dummy gate 200 is used for occupying a space position for the subsequent formation of the gate structure 400**.

In this example, the dummy gate 200 is a polysilicon gate structure. That is, the dummy gate 200 includes a dummy gate layer, and a material of the dummy gate layer is polysilicon. In other examples, the material of the dummy gate layer may further include silicon oxide, silicon nitride, silicon oxynitride, silicon carbide, silicon carbonitride, silicon oxycarbonitride, amorphous carbon or other materials. In an example, the dummy gate 200 is a single-layer structure, and the dummy gate 200 only includes a dummy gate layer. In other examples, the dummy gate may alternatively be a laminated structure, which correspondingly includes a dummy gate oxide layer and a dummy gate layer located on the dummy gate oxide layer. A material of the dummy gate oxide layer may be silicon oxide.

Still referring to FIG. 6, the dummy spacer 220 is formed on a side wall of the dummy gate 200. The dummy spacer 220 is used for protecting the side wall of the dummy gate 200 and defining a formation position of the source/drain doped area 110. The dummy spacer 220 and the source/drain doped area 110 are located in the device area 100*b*.

It should be noted that a subsequent step is further included: the dummy spacer 220 is removed to form a gap at the position of the dummy spacer 220. Therefore, the dummy spacer 220 is used for occupying a space for the formation of the gap. After the subsequent formation of the gap, a top dielectric layer whose material has a smaller dielectric constant is formed. In order to make the material of the top dielectric layer have a low dielectric constant, the material of the top dielectric layer is typically a material with loose structure and low density. Therefore, by firstly forming the dummy spacer 220 for occupying the space for the gap, the material of the dummy spacer 220 can be selected flexibly. This makes the material of the dummy spacer 220 compatible with the subsequent process, and accordingly, is beneficial to improving the performance of the semiconductor structure. For example, due to the high etching resistance of the dummy spacer 220, during the subsequent removal of the dummy gate 200, the probability of damage to the dummy spacer 220 is low, or during the formation of the source/drain doped area 110, the probability of damage to the dummy spacer 220 is low. Besides, since the dummy spacer 220 will be removed subsequently, the material of the dummy spacer 220 is selected such that: during the removal of the dummy spacer 220, there is a high etch selectivity between the dummy spacer 220 and other film layers (for example, the gate structure and the contact etch stop layer 300), so that the process of removing the dummy spacer 220 causes little damage to other film layers.

The dummy spacer 220 may be a single-layer structure or a laminated structure. The material of the dummy spacer 220 may include one or more of silicon oxide, silicon nitride, silicon carbide, silicon oxynitride, boron nitride, aluminum oxide and aluminum nitride. In this example, the dummy spacer 220 is a single-layer structure, and the material of the dummy spacer 220 is silicon oxide. The silicon oxide has high hardness and density, so the subsequent process causes little damage to the dummy spacer 220, which makes the dummy spacer 220 compatible with the subsequent process. Moreover, the silicon oxide is a material that can be easily removed, which facilitates the subsequent removal of the dummy spacer 220.

It should be noted that after the subsequent removal of the dummy spacer 220, the gap is formed at the position of the dummy spacer 220, and the spacer is formed in the gap. Therefore, when a width of the dummy spacer 220 is too small, it is difficult for the material of the spacer to fill the gap, resulting in a poor effect of reducing the effective capacitance between the gate structure and the source/drain plug. When the width of the dummy spacer 220 is too large, a distance between the source/drain doped area 110 and the subsequent gate structure will be too large accordingly, which will result in an excessive channel length and thereby excessive device dimensions, making it difficult to meet the development requirements of device miniaturization. Therefore, in this example, in a direction parallel to a surface of the substrate 100 and perpendicular to the side wall of the dummy gate 200, the width of the dummy spacer 220 is 2 nm to 12 nm. For example, the width of the dummy spacer 220 is 5 nm, 7 nm or 10 nm.

Specifically, the step of forming the dummy spacer 220 includes: a dummy spacer material layer (not shown) conformally covering the dummy gate 200 and the substrate 100 is formed; and the dummy spacer material layer on two sides of the dummy gate 200 is removed to expose a part of the substrate 100 on the two sides of the dummy gate 200, and the remaining dummy spacer material layer serves as the dummy spacer 220. By removing the dummy spacer material layer on the two sides of the dummy gate 200, the part of the substrate 100 on the two sides of the dummy gate 200 is exposed, thereby preparing for the subsequent formation of the source/drain doped area 110. Accordingly, in this example, the dummy spacer 220 also covers the top of the dummy gate 200.

It should also be noted that before the dummy spacer material layer is formed, the forming method further includes: an offset spacer 210 conformally covering the dummy gate 200 and the substrate 100 is formed. The offset spacer 210 is used for increasing the channel length of the formed transistor, thereby improving the short-channel effect and the hot carrier effect caused by the short-channel effect. Accordingly, in order to form the source/drain doped area, after the dummy spacer 220 is formed, the offset spacer 210 exposed by the dummy spacer 220 is further removed, so the remaining offset spacer 210 is located between the dummy spacer 220 and the dummy gate 200 and between the dummy spacer 220 and the substrate 100.

A material of the offset spacer 210 is silicon oxide, silicon nitride, silicon oxynitride, silicon oxycarbonitride, silicon oxyboronitride or silicon oxyborocarbonitride. In this example, the material of the offset spacer 210 is silicon nitride.

Still referring to FIG. 6, after the dummy spacer 220 is formed, the source/drain doped area 110 is formed in the substrate 100 on the two sides of the dummy gate 200. Specifically, the source/drain doped area 110 is located in the device area 100*b* (as shown in FIG. 5). The source/drain doped area 110 serves as a source area or a drain area of the formed transistor.

In this example, by an epitaxial process, the source/drain doped area 110 is formed. Specifically, the step of forming the source/drain doped area 110 includes: using the dummy spacer 220 as a mask, the substrate 100 on the two sides of the dummy gate 200 is etched to form a groove; and an epitaxial layer is formed in the groove by an epitaxial process, and during the formation of the epitaxial layer, ions are autodoped in situ. The ion-doped epitaxial layer serves as the source/drain doped area 110. When an NMOS transistor is formed, a material of the epitaxial layer is Si or SiC, and the epitaxial layer provides tensile stress for a channel area of the NMOS transistor, which thereby is beneficial to improving the carrier mobility of the NMOS transistor. The doping ions in the epitaxial layer are N-type ions, and the N-type ions include P ions, As ions or Sb ions. When a PMOS transistor is formed, a material of the epitaxial layer is Si or SiGe, and the epitaxial layer provides compression stress for a channel area of the PMOS transistor, which thereby is beneficial to improving the carrier mobility of the PMOS transistor. The doping ions in the epitaxial layer are P-type ions, and the P-type ions include B ions, Ga ions or In ions.

Figure 7:
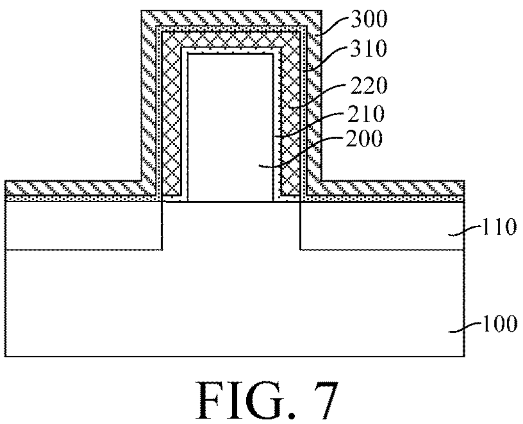

Referring to FIG. 7, after the source/drain doped area 110 is formed, the contact etch stop layer 300 conformally covering the dummy spacer 220, the dummy gate 200 and the substrate 100 is formed.

During the subsequent formation of the source/drain plug contacting the source/drain doped area 110, a step of etching the bottom dielectric layer is included. During the etching of the bottom dielectric layer, an etch stop position is defined by using the contact etch stop layer 300, thereby preventing the source/drain doped area 110 from being overetched. Accordingly, there is a high etch selectivity between the contact etch stop layer 300 and the subsequently formed bottom dielectric layer. A material of the contact etch stop layer 300 includes a low k dielectric material (the low k dielectric material refers to a dielectric material with a relative dielectric constant of equal to or greater than 2.6 and less than or equal to 3.9), an ultra-low k dielectric material (the ultra-low k dielectric material refers to a dielectric material with a relative dielectric constant of less than 2.6) or silicon nitride.

It should be noted that after the source/drain plug is formed on the source/drain doped area 110 subsequently, the contact etch stop layer 300 is also located between the source/drain plug and the gate structure. Therefore, the contact etch stop layer 300 also affects the effective capacitance between the source/drain plug and the gate structure. The lower the dielectric constant of the material of the contact etch stop layer 300, the lower the effective capacitance between the source/drain plug and the gate structure. Therefore, in this example, in order to make the dielectric constant of the material of the contact etch stop layer 300 low, the material of the contact etch stop layer 300 is a low k dielectric material or an ultra-low k dielectric material.

In this example, an anti-diffusion layer 310 is further formed between the dummy spacer 220 and the contact etch stop layer 300. The anti-diffusion layer 310 is used for preventing diffusible ions in the dummy spacer 220 from diffusing into the contact etch stop layer 300, thereby avoiding the increase in the dielectric constant of the material of the contact etch stop layer 300 due to ion diffusion.

Specifically, the material of the contact etch stop layer 300 is a low k dielectric material or an ultra-low k dielectric material, and the material of the dummy spacer 220 is an oxygen-containing material (for example, silicon oxide). When oxide ions diffuse into the contact etch stop layer 300, the dielectric constant of the material of the contact etch stop layer 300 will increase, so the anti-diffusion layer 310 formed between the dummy spacer 220 and the contact etch stop layer 300 can reduce the probability of the increase in the dielectric constant of the material of the contact etch stop layer 300. Therefore, the anti-diffusion layer 310 has high density. Moreover, the anti-diffusion layer 310 is reserved subsequently, so the material of the anti-diffusion layer 310 is an insulating material. Specifically, the material of the anti-diffusion layer 310 includes one or more of silicon nitride, silicon carbide, silicon carbonitride, silicon oxycarbonitride, silicon oxynitride, boron nitride, boron carbonitride, aluminum oxide and aluminum nitride. In an example, the material of the anti-diffusion layer 310 is silicon nitride.

It should be noted that the anti-diffusion layer 310 is also located between the source/drain plug and the gate structure, so the anti-diffusion layer 310 also affects the effective capacitance between the source/drain plug and the gate structure. Due to the high dielectric constant of the material of the anti-diffusion layer 310, an excessively large thickness of the anti-diffusion layer 310 may easily lead to an excessive effective capacitance between the source/drain plug and the gate structure and an excessive distance between the source/drain doped area 110 and the gate structure, which will result in an excessive channel length and thereby excessive device dimensions, making it difficult to meet the development requirements of device miniaturization. Therefore, while ensuring the effectiveness of the anti-diffusion layer 310 in preventing ion diffusion, the thickness of the anti-diffusion layer 310 is less than or equal to 30 Å, taking into account the above effects.

In this example, the thickness of the anti-diffusion layer 310 is less than or equal to 15 Å, thereby realizing a low effective capacitance between the source/drain plug and the gate structure while ensuring the effectiveness of the anti-diffusion layer 310 in preventing ion diffusion. An excessively small thickness of the anti-diffusion layer 310 may cause the anti-diffusion layer 310 to become less effective in preventing ion diffusion. Therefore, in this example, the thickness of the anti-diffusion layer 310 is 5 Å to 15 Å. For example, the thickness of the anti-diffusion layer 310 is 10 Å.

In this example, after the source/drain doped area 110 is formed and before the contact etch stop layer 300 is formed, the anti-diffusion layer 310 conformally covering the dummy spacer 220, the dummy gate 200 and the substrate 100 is formed, and the contact etch stop layer 300 is correspondingly formed on the anti-diffusion layer 310.

A process of forming the anti-diffusion layer 310 includes atomic layer deposition, chemical vapor deposition or plasma enhanced chemical vapor deposition. In this example, the anti-diffusion layer 310 is formed by atomic layer deposition. The anti-diffusion layer 310 has a small thickness. By adopting the atomic layer deposition, it is easy to form the anti-diffusion layer 310 with a small thickness. Moreover, the anti-diffusion layer 310 has good thickness uniformity, and in addition, the anti-diffusion layer 310 has good step covering power.

Figure 8:
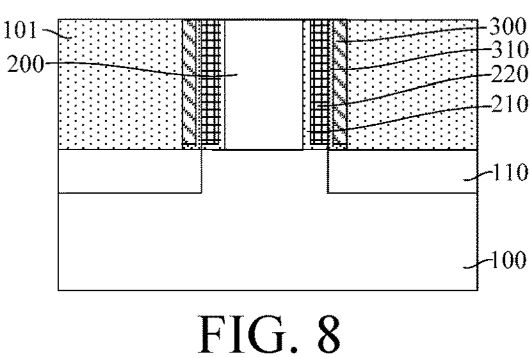

Referring to FIG. 8, after the contact etch stop layer 300 is formed, a bottom dielectric layer 101 is formed on the substrate 100 at a side of the dummy gate 200.

The bottom dielectric layer 101 is used for isolating adjacent devices. In this example, the bottom dielectric layer 101 is an inter layer dielectric (ILD). A material of the bottom dielectric layer 101 is an insulating material, including one or more of silicon oxide, silicon nitride, silicon oxynitride, silicon oxycarbide, silicon carbonitride and silicon oxycarbonitride. In an example, the material of the bottom dielectric layer 101 is silicon oxide.

Specifically, the bottom dielectric layer 101 is formed by deposition and planarization (for example, chemical mechanical polishing), so that the bottom dielectric layer 101 exposes the top of the dummy gate 200. In this example, the top of the bottom dielectric layer 101 is flush with the top of the dummy gate 200. During the formation of the bottom dielectric layer 101, the contact etch stop layer 300, the anti-diffusion layer 310, the dummy spacer 220 and the offset spacer 210 higher than the tops of the dummy spacer 220 and the dummy gate 200 are removed.

Figure 9:
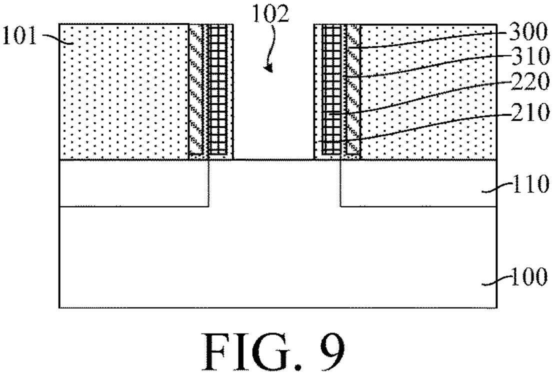
Figure 10:
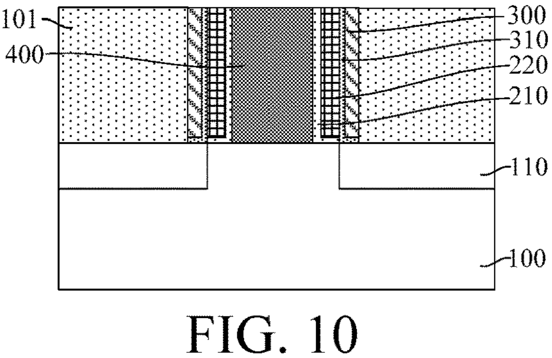

Referring to FIG. 9 and FIG. 10, the dummy gate 200 is removed to form a gate opening 102 in the bottom dielectric layer 101 (as shown in FIG. 9). The gate structure 400 is formed in the gate opening 102 (as shown in FIG. 10).

Accordingly, the gate structure 400 is located in the device area 100*b* (as shown in FIG. 5), and the bottom dielectric layer 101 is formed on the substrate 100 exposed by the gate structure 400. The bottom dielectric layer 101 covers the source/drain doped area 110.

During the operation of the transistor, the gate structure 400 is used for controlling a conductive channel to be on or off. Specifically, the gate structure 400 is a metal gate structure. The gate structure 400 includes a high k gate dielectric layer (not shown) conformally covering a bottom and a side wall of the gate opening 102, a work function layer (not shown) located on the high k gate dielectric layer, and a gate electrode layer (not shown) located on the work function layer.

A material of the high k gate dielectric layer is a high k dielectric material. The high k dielectric material is a dielectric material with a relative dielectric constant greater than the relative dielectric constant of the silicon oxide. Specifically, the material of the high k gate dielectric layer may be selected from $HfO_2$, $ZrO_2$, HfSiO, HfSiON, HfTaO, HfSiO, HfZrO, $Al_2O_3$ or the like. In an example, the material of the high k gate dielectric layer is $HfO_2$.

The work function layer is used for adjusting a threshold voltage of the formed transistor. When a PMOS transistor is formed, the work function layer is a P-type work function layer, and a material of the P-type work function layer includes one or more of TiN, TaN, TaSiN, TaAlN and TiAlN. When an NMOS transistor is formed, the work function layer is an N-type work function layer, and a material of the N-type work function layer includes one or more of TiAl, Mo, MoN, AlN and TiAlC.

The gate electrode layer is used for electrically leading out the gate structure 200. In this example, a material of the gate electrode layer is Al, Cu, Ag, Au, Pt, Ni, Ti or W.

It should be noted that the dummy spacer 220 has high density and hardness, so the process of removing the dummy gate 200 causes little damage to the dummy spacer 220.

Referring to FIG. 11, after the gate structure 400 is formed, the forming method further includes: in the device area 100*b* (as shown in FIG. 5), a bottom source/drain plug 120 running through the bottom dielectric layer 101 above the source/drain doped area 110 and contacting the source/drain doped area 110, and a source/drain cap layer 130 located at a top surface of the bottom source/drain plug 120 are formed.

In this example, a top source/drain plug contacting the bottom source/drain plug 120 is subsequently formed on the bottom source/drain plug 120, so that the top source/drain plug and the bottom source/drain plug 120 form the source/drain plug.

In this example, a material of the bottom source/drain plug 120 is copper. The low resistivity of copper is beneficial to improving the signal delay of RC of BEOL, increasing the processing speed of the chip and reducing the resistance of the bottom source/drain plug 120, thereby correspondingly reducing the power consumption. In other examples, the material of the bottom source/drain plug may alternatively be a conductive material such as tungsten and cobalt.

After the sacrificial dielectric layer is subsequently formed on the bottom dielectric layer 101 (as shown in FIG. 10), a gate plug contacting the gate structure 400 is formed in the sacrificial dielectric layer at the top of the gate structure 400 in the active area (AA). The source/drain cap layer 130 is located at the top surface of the bottom source/drain plug 120 and used for protecting the bottom source/drain plug 120 during the formation of the gate plug, which is beneficial to reducing the probability of damage to the bottom source/drain plug 120 and the probability of short-circuiting between the gate plug and the bottom source/drain plug 120.

The source/drain cap layer 130 is made of a material having a high etch selectivity with the gate cap layer, the dummy spacer 220, the bottom dielectric layer 101 and the subsequently formed sacrificial dielectric layer, which is thereby beneficial to ensuring that the source/drain cap layer 130 can protect the bottom source/drain plug 120. In this example, the material of the source/drain cap layer 130 includes one or more of silicon nitride, silicon carbide, silicon carbonitride, silicon oxycarbonitride, silicon oxynitride, boron nitride and boron carbonitride. Specifically, the materials of the source/drain cap layer 130 and the gate cap layer are different, and the materials of the source/drain cap layer 130 and the dummy spacer 220 are different. In an example, the material of the source/drain cap layer 130 is silicon carbide.

In this example, the top surfaces of the source/drain cap layer 130 and the bottom dielectric layer 101 are flush with each other. FIG. 11 is a sectional view of the device area 100*b*, which thereby does not show the bottom dielectric layer 101 located in the isolation area 100*a* (as shown in FIG. 5).

In this example, the forming method further includes: a gate cap layer 410 located at the top surface of the gate structure 400 is formed. During the subsequent formation of the top source/drain plug, the gate cap layer 410 is used for protecting the gate structure 400, thereby reducing the probability of damage to the gate structure 400 and the probability of short-circuiting between the top source/drain plug and the gate structure 400 during the formation of the top source/drain plug. Specifically, the gate structure 400 is etched back to remove a partial thickness of the gate structure 400. After the partial thickness of the gate structure 400 is removed, the gate cap layer 410 is formed on the top of the remaining gate structure 400. In this example, the top surfaces of the gate cap layer 410 and the bottom dielectric layer 101 are flush with each other.

The gate cap layer 410 is made of a material having an etch selectivity with the source/drain cap layer 130, the bottom dielectric layer 101 and the subsequently formed sacrificial dielectric layer, which is thereby beneficial to ensuring that the gate cap layer 410 can protect the gate structure 400. In this example, the material of the gate cap layer 410 includes one or more of silicon nitride, silicon carbide, silicon carbonitride, silicon oxycarbonitride, silicon oxynitride, boron nitride and boron carbonitride. In an example, the material of the gate cap layer 410 is silicon nitride.

Referring to FIG. 12, a sacrificial dielectric layer 140 is formed above the tops of the source/drain doped area 110 and the gate structure 400.

Specifically, the sacrificial dielectric layer 140 is formed on the bottom dielectric layer 101. The sacrificial dielectric layer 140 is used for providing a process basis for the subsequent formation of the top source/drain plug and the gate plug.

A material of the sacrificial dielectric layer 140 is an insulating material. Moreover, the sacrificial dielectric layer 140 will be etched subsequently, so the sacrificial dielectric layer 140 should be made of an easily etchable material. The material of the sacrificial dielectric layer 140 includes one or more of silicon oxide, silicon nitride, silicon carbide, silicon oxynitride, boron nitride, aluminum oxide and aluminum nitride. In this example, the material of the sacrificial dielectric layer 140 is the same as the material of the dummy spacer 220, so that the sacrificial dielectric layer 140 and the dummy spacer 220 can be etched in the same subsequent etching step. Accordingly, in this example, the material of the sacrificial dielectric layer 140 is silicon oxide.

Referring to FIG. 13 and FIG. 14, a source/drain plug 180 (as shown in FIG. 14) running through the sacrificial dielectric layer 140 above the top of the source/drain doped area 110 and contacting the source/drain doped area 110 is formed.

The source/drain plug 180 is used for realizing electrical connection between the source/drain doped area 110 and an external circuit or other interconnect structures. In this example, the step of forming the source/drain plug 180 includes: a top source/drain plug 122 running through the sacrificial dielectric layer 140 and the source/drain cap layer 130 above the top of the source/drain doped area 110 is formed. The top source/drain plug 125 contacts the bottom source/drain plug 120, and the top source/drain plug 122 and the bottom source/drain plug 120 form the source/drain plug 180.

Specifically, as shown in FIG. 13, the sacrificial dielectric layer 140 and the source/drain cap layer 130 above the top of the source/drain doped area 110 are etched sequentially to form a source/drain contact 160 exposing the bottom source/drain plug 120. As shown in FIG. 14, the top source/drain plug 122 is formed in the source/drain contact 160. For the specific description of the material of the top source/drain plug 122, reference may be made to the foregoing description of the bottom source/drain plug 120, and details will not be repeated here.

In this example, the forming method further includes: a gate plug 170 (as shown in FIG. 14) running through the sacrificial dielectric layer 140 and the gate cap layer 410 above the tops of the gate structure 400 (as shown in FIG. 12) and contacting the gate structure 400 is formed.

The gate plug 170 is used for realizing electrical connection between the gate structure 400 and an external circuit or other interconnect structures. In this example, the gate plug 170 is formed above the gate structure 400 in the active area. The gate plug 170 is a contact over active gate (COAG). Compared with the solution in which the gate plug contacts the gate structure in the isolation area, this example omits the part of the gate structure 400 in the isolation area, which is beneficial to saving the area of the chip and further reducing chip dimensions. For the specific description of the material of the gate plug 170, reference may be made to the foregoing description of the bottom source/drain plug 120, and details will not be repeated here.

Specifically, as shown in FIG. 13, the sacrificial dielectric layer 140 and the gate cap layer 410 above the top of the gate structure 400 are etched sequentially to form a gate contact 150 exposing the top of the gate structure 400. As shown in FIG. 14, the gate plug 170 is formed in the gate contact 150.

In this example, after the source/drain contact 160 and the gate contact 150 are formed, the top source/drain plug 125 and the gate plug 170 are formed in the same step. It should be noted that in this example, before the sacrificial dielectric layer 140 is etched, the gate plug 170 is formed, thereby reducing the changes to the existing process and improving the process compatibility of the forming method.

Referring to FIG. 15, after the source/drain plug 180 is formed, the sacrificial dielectric layer 140 is etched until the top of the dummy spacer 220 (as shown in FIG. 13) is exposed. After the top of the dummy spacer 220 is exposed, the dummy spacer 220 is removed to form a gap 190 between the contact etch stop layer 300 and the side wall of the gate structure 400.

The gap 190 is used for providing a space position for the subsequent formation of the spacer.

In this example, the step of etching the sacrificial dielectric layer 140 until the top of the dummy spacer 220 is exposed includes: the sacrificial dielectric layer 140 located in the device area **100*b* (as shown in FIG. 5) is removed. By only removing the sacrificial dielectric layer 140 in the device area 100*b*, the effect on the isolation area 100*a* (as shown in FIG. 5) is reduced. The top dielectric layer filling between the source/drain plugs 180 is formed subsequently. In this example, only the sacrificial dielectric layer 140 is etched, and the bottom dielectric layer 101 is not etched. Accordingly, the top dielectric layer fills between the top source/drain plugs 125**, and the space filled by the top dielectric layer has a small aspect ratio, which reduces the difficulty of the process of forming the top dielectric layer and is beneficial to improving the quality of the formed top dielectric layer.

In this example, by isotropic etching, the sacrificial dielectric layer 140 and the dummy spacer 220 in the device area **100*b* are removed. The use of the isotropic etching can completely remove the sacrificial dielectric layer 140 and the dummy spacer 220 in the device area 100*b***, and moreover, the etching speed is high.

In this example, the isotropic etching is remote plasma etching. The remote plasma etching has the characteristics of isotropic etching. Moreover, the remote plasma etching also has good etch selectivity, thereby reducing the loss of other film layers during etching. The remote plasma etching is based on the following principle: plasma is formed outside the etching chamber (for example, the plasma is generated by a remote plasma generator), and then introduced into the etching chamber, and the etching is performed by utilizing a chemical reaction between the plasma and the layer to be etched. Therefore, the isotropic etching effect can be realized. Moreover, there is no ion bombardment, so the remote plasma etching does not damage other film layers. In other examples, the isotropic etching may alternatively be wet etching.

It should be noted that the materials of the sacrificial dielectric layer 140 and the dummy spacer 220 are the same, so the sacrificial dielectric layer 140 and the dummy spacer 220 in the device area **100*b*** can be removed in the same etching step, thereby simplifying the process steps.

Referring to FIG. 16, a top dielectric layer 500 filling between the source/drain plugs 180 is formed, and the top dielectric layer 500 further fills the gap 190 to form a spacer 510 in the gap 190. A dielectric constant of a material of the top dielectric layer 500 is less than a dielectric constant of the material of the dummy spacer 220 (as shown in FIG. 14). Specifically, the top dielectric layer 500 fills between the source/drain plug 180 and the gate plug 170.

By removing the dummy spacer 220 and forming the top dielectric layer 500 whose material has a lower dielectric constant, the spacer 510 whose material has a lower dielectric constant is formed, so that the effective capacitance between the gate structure 400 and the source/drain plug 180 (specifically, the bottom source/drain plug 120) is reduced, thereby improving the performance of the semiconductor structure.

In this example, the material of the top dielectric layer 500 includes a low k dielectric material or an ultra-low k dielectric material, so that the material of the spacer 510 has a low dielectric constant, thereby reducing the effective capacitance between the gate structure 400 and the source/drain plug 180. Moreover, in this example, in order to further reduce the area of the transistor, a contact over active gate (COAG) process is introduced. The distance between the gate plug 170 and the source/drain plug 180 is correspondingly small, and the top dielectric layer 500 fills between the source/drain plugs 180. Therefore, the formation of the top dielectric layer 500 whose material has a low dielectric constant is also beneficial to reducing the parasitic capacitance between the gate plug 170 and the source/drain plug 180. Besides, the formation of the top dielectric layer 500 whose material has a low dielectric constant is also beneficial to reducing RC delay of the interconnect structure in the integrated circuit.

In other examples, when the gap has a large aspect ratio (AR), the top dielectric layer seals the top of the gap to form an air gap. The air has a low dielectric constant, and accordingly can reduce the effective capacitance between the gate structure and the source/drain plug.

In this example, the top dielectric layer 500 is formed by spin-on coating. The spin-on coating is performed at a low temperature, which avoids the channel degradation caused by a high temperature and is beneficial to improving the performance of the semiconductor structure. In other examples, the top dielectric layer may alternatively be formed by chemical vapor deposition, fluid chemical vapor deposition or atomic layer deposition.

In this example, the top dielectric layer 500 covers the top of the source/drain plug 180. The subsequent process further includes: a metal line electrically connecting the source/drain plugs 180 is formed on the top of the source/drain plug 180. The metal line is formed in an inter metal dielectric (IMD) layer. By making the top dielectric layer 500 cover the top of the source/drain plug 180, the top dielectric layer 500 higher than the top of the source/drain plug 180 serves as the inter metal dielectric layer, thereby simplifying the process steps of the BEOL. In other examples, the top of the top dielectric layer is flush with the top of the source/drain plug, or the top of the top dielectric layer is lower than the top of the source/drain plug, so that the material of the inter metal dielectric layer can be selected flexibly to meet the performance requirements of the semiconductor structure.

It should be noted that in this example, the COAG process is taken as an example. In other examples, when the gate plug is located at the top of the gate structure in the isolation area, this method can still reduce the effective capacitance between the source/drain plug and the gate structure.

Accordingly, the disclosure further provides a semiconductor structure. Still referring to FIG. 16, a schematic structural diagram of an example of a semiconductor structure of the disclosure is shown.

The semiconductor structure includes: a substrate 100; a gate structure 400, located on the substrate 100; a source/drain doped area 110, located in the substrate 100 on two sides of the gate structure 400; a contact etch stop layer 300, located on the substrate 100 between the source/drain doped area 110 and the gate structure 400 and arranged opposite to a side wall of the gate structure 400, a gap 190 being provided between the contact etch stop layer 300 and the side wall of the gate structure 400 (as shown in FIG. 14); a source/drain plug 180, located at a top of the source/drain doped area 110 and contacting the source/drain doped area 110; and a top dielectric layer 500, filling between the source/drain plugs 180, the top dielectric layer 500 further filling the gap 190 and the top dielectric layer 500 located in the gap 190 serving as a spacer 510, or the top dielectric layer 500 sealing a top of the gap 190 to form an air gap, and a material of the top dielectric layer 500 being a low k dielectric material or an ultra-low k dielectric material.

In this example, the substrate 100 is a planar base. In other examples, the substrate includes a base and a fin protruding from the base. In this example, the substrate 100 is a silicon base. In some other examples, the substrate may alternatively be a base of another type of material. For example, the material of the substrate may be another material such as germanium, silicon-germanium, silicon carbide, gallium arsenide and indium-gallium. The substrate may alternatively be another type of base such as a silicon on insulator base and a germanium on insulator base.

As shown in FIG. 5, FIG. 5 is a top view. In this example, the substrate 100 includes a device area 100*b* and an isolation area 100*a*. The device area 100*b* is used for forming a transistor. An area other than the device area 100*b* is the isolation area 100*a*. In this example, the device area 100*b* is an active area.

FIG. 16 is a sectional view of FIG. 5 taken along line A1A2.

The gate structure 400 is located on the substrate 100 in the device area 100*b*. The gate structure 400 is used for controlling a conductive channel to be on or off. Specifically, the gate structure 400 is a metal gate structure, including a high k gate dielectric layer (not shown), a work function layer (not shown) located on the high k gate dielectric layer, and a gate electrode layer (not shown) located on the work function layer. For the specific description of the gate structure 400, reference may be made to the corresponding description in the foregoing example, and details will not be repeated here.

It should be noted that the semiconductor structure further includes: an offset spacer 210, located on the side wall of the gate structure 400 exposed by the gap 190. The offset spacer 210 is used for increasing the channel length of the formed transistor, thereby improving the short-channel effect and the hot carrier effect caused by the short-channel effect. A material of the offset spacer 210 is silicon oxide, silicon nitride, silicon oxynitride, silicon oxycarbonitride, silicon oxyboronitride or silicon oxyborocarbonitride. In this example, the material of the offset spacer 210 is silicon nitride.

In this example, in the forming method of the semiconductor structure, by removing the dummy spacer to form the gap 190 and forming the offset spacer 210 before the dummy spacer is formed, the offset spacer 210 also extends to cover a bottom of the gap 190.

The source/drain doped area 110 is located in the device area 100*b*, and the source/drain doped area 110 serves as a source area or a drain area of the formed transistor. The source/drain doped area 110 is formed by an epitaxial process. The source/drain doped area 110 includes an ion-doped epitaxial layer. When the semiconductor structure is an NMOS transistor, a material of the epitaxial layer is Si or SiC, and doping ions in the epitaxial layer are N-type ions. The N-type ions include P ions, As ions or Sb ions. When the semiconductor structure is a PMOS transistor, a material of the epitaxial layer is Si or SiGe, and doping ions in the epitaxial layer is P-type ions. The P-type ions include B ions, Ga ions or In ions.

In this example, the semiconductor structure further includes: a bottom dielectric layer 101 (as shown in FIG. 9), located on the substrate 100 at a side of the gate structure 400. The bottom dielectric layer 101 covers the source/drain doped area 110.

The bottom dielectric layer 101 is used for isolating adjacent devices. In this example, the bottom dielectric layer 110 is an inter layer dielectric. A material of the bottom dielectric layer 101 is an insulating material, including one or more of silicon oxide, silicon nitride, silicon oxynitride, silicon oxycarbide, silicon carbonitride and silicon oxycarbonitride. In an example, the material of the bottom dielectric layer 101 is silicon oxide.

During the formation of the semiconductor structure, the contact etch stop layer 300 covers the side wall of the dummy spacer, and the gap 190 is formed by removing the dummy spacer. Therefore, the contact etch stop layer 300 is located on the substrate 100 between the source/drain doped area 110 and the gate structure 400 and arranged opposite to the side wall of the gate structure 400, and the gap 190 is provided between the contact etch stop layer 300 and the side wall of the gate structure 400.

During the formation of the source/drain plug 180, a step of etching the bottom dielectric layer 101 is included. During the etching of the bottom dielectric layer 101, an etch stop position is defined by using the contact etch stop layer 300, thereby preventing the source/drain doped area 110 from being overetched. Accordingly, there is a high etch selectivity between the contact etch stop layer 300 and the bottom dielectric layer 101. A material of the contact etch stop layer 300 includes a low k dielectric material, an ultra-low k dielectric material or silicon nitride.

It should be noted that the contact etch stop layer 300 is also located between the source/drain plug 180 and the gate structure 400. Therefore, the contact etch stop layer 300 also affects the effective capacitance between the source/drain plug 180 and the gate structure 400. The lower the dielectric constant of the material of the contact etch stop layer 300, the lower the effective capacitance between the source/drain plug 180 and the gate structure 400. Therefore, in this example, in order to make the dielectric constant of the material of the contact etch stop layer 300 low, the material of the contact etch stop layer 300 is a low k dielectric material or an ultra-low k dielectric material.

Therefore, in this example, the semiconductor structure further includes: an anti-diffusion layer 310, located on a side wall of the contact etch stop layer 300 exposed by the gap 190. The anti-diffusion layer 310 is used for preventing diffusible ions in the dummy spacer from diffusing into the contact etch stop layer 300, thereby avoiding the increase in the dielectric constant of the material of the contact etch stop layer 300 due to ion diffusion. Specifically, the material of the contact etch stop layer 300 is a low k dielectric material or an ultra-low k dielectric material, and the material of the dummy spacer is typically an oxygen-containing material (for example, silicon oxide). When oxide ions diffuse into the contact etch stop layer 300, the dielectric constant of the material of the contact etch stop layer 300 will increase, so the anti-diffusion layer 310 can reduce the probability of the increase in the dielectric constant of the material of the contact etch stop layer 300.

Therefore, the anti-diffusion layer 310 has high density, and the material of the anti-diffusion layer 310 is an insulating material. Specifically, the material of the anti-diffusion layer 310 includes one or more of silicon nitride, silicon carbide, silicon carbonitride, silicon oxycarbonitride, silicon oxynitride, boron nitride, boron carbonitride, aluminum oxide and aluminum nitride. In an example, the material of the anti-diffusion layer 310 is silicon nitride.

It should be noted that the anti-diffusion layer 310 is also located between the source/drain plug 180 and the gate structure 400, so the anti-diffusion layer 310 also affects the effective capacitance between the source/drain plug 180 and the gate structure 400. Due to the high dielectric constant of the material of the anti-diffusion layer 310, an excessively large thickness of the anti-diffusion layer 310 may easily lead to an excessive effective capacitance between the source/drain plug 180 and the gate structure 400 and an excessive distance between the source/drain doped area 110 and the gate structure 400, which will result in an excessive channel length and thereby excessive device dimensions, making it difficult to meet the development requirements of device miniaturization. Therefore, while ensuring the effectiveness of the anti-diffusion layer 310 in preventing ion diffusion, the thickness of the anti-diffusion layer 310 is less than or equal to 30 Å, taking into account the above effects.

In this example, the thickness of the anti-diffusion layer 310 is less than or equal to 15 Å, thereby ensuring a low effective capacitance between the source/drain plug 180 and the gate structure 400 while ensuring the effectiveness of the anti-diffusion layer 310 in preventing ion diffusion. An excessively small thickness of the anti-diffusion layer 310 may cause the anti-diffusion layer 310 to become less effective in preventing ion diffusion. Therefore, the thickness of the anti-diffusion layer 310 is 5 Å to 15 Å.

In this example, in a direction parallel to a surface of the substrate 100 and perpendicular to the side wall of the gate structure 400, the width of the gap 190 should not be too small or too large. When the width of the gap 190 is too small, it is difficult for the material of the top dielectric layer 500 to fill the gap 190, resulting in poor effect of reducing the parasitic capacitance between the gate structure 400 and the source/drain plug 180. When the width of the gap 190 is too large, a distance between the source/drain doped area 110 and the gate structure 400 will be too large accordingly, which will result in an excessive channel length and thereby excessive device dimensions, making it difficult to meet the development requirements of device miniaturization. Therefore, in this example, the width of the gap 190 is 2 nm to 12 nm.

In this example, during the formation of the semiconductor structure, after the source/drain doped area 110 is formed and before the contact etch stop layer 300 is formed, an anti-diffusion layer 310 is formed. Therefore, the anti-diffusion layer 310 is also located between a bottom of the contact etch stop layer 300 and the substrate 100.

The source/drain plug 180 is used for realizing electrical connection between the source/drain doped area 110 and an external circuit or other interconnect structures. In this example, a material of the source/drain plug 180 is copper. In other examples, the material of the source/drain plug may alternatively be a conductive material such as tungsten and cobalt.

In this example, the gate plug in the semiconductor structure is a contact over active gate (COAG). Therefore, the source/drain plug 180 includes: a bottom source/drain plug 120, running through the bottom dielectric layer 101 above the source/drain doped area 110 and contacting the source/drain doped area 110; and a top source/drain plug 122, located on the bottom source/drain plug 120 and contacting the bottom source/drain plug 120.

Accordingly, the semiconductor structure further includes: a source/drain cap layer 130, located between a top of the bottom source/drain plug 120 and the top dielectric layer 500. The semiconductor structure typically further includes: a gate plug, located in the top dielectric layer 500 at a top of the gate structure 400 in the active area and contacting the gate structure 400. The source/drain cap layer 130 is located at a top surface of the bottom source/drain plug 120 and used for protecting the bottom source/drain plug 120 during the formation of the gate plug, which is beneficial to reducing the probability of damage to the bottom source/drain plug 120 and the probability of short-circuiting between the gate plug and the bottom source/drain plug 120.

The source/drain cap layer 130 is made of a material having a high etch selectivity with the gate cap layer, the dummy spacer 220, the bottom dielectric layer 101 and the top dielectric layer 500, which is thereby beneficial to ensuring that the source/drain cap layer 130 can protect the bottom source/drain plug 120. In this example, the material of the source/drain cap layer 130 includes one or more of silicon nitride, silicon carbide, silicon carbonitride, silicon oxycarbonitride, silicon oxynitride, boron nitride and boron carbonitride. In an example, the material of the source/drain cap layer 130 is silicon carbide.

In this example, the top surfaces of the source/drain cap layer 130 and the bottom dielectric layer 101 are flush with each other.

In this example, the semiconductor structure further includes: a gate plug 170, located at the top of the gate structure 400 and contacting the gate structure 400. The gate plug 170 is used for realizing electrical connection between the gate structure 400 and an external circuit or other interconnect structures. In this example, the gate plug 170 is formed above the gate structure 400 in the active area. That is, the gate plug 170 is a contact over active gate. Compared with the solution in which the gate plug contacts the gate structure in the isolation area, this example omits the part of the gate structure 400 in the isolation area, which is beneficial to saving the area of the chip and further reducing chip dimensions.

Accordingly, the semiconductor structure further includes: a gate cap layer 410 (as shown in FIG. 12), located between the top of the gate structure 400 and the top dielectric layer 500. During the formation of the top source/drain plug 122, the gate cap layer 410 is used for protecting the gate structure 400, thereby reducing the probability of damage to the gate structure 400 and the probability of short-circuiting between the top source/drain plug 122 and the gate structure 400 during the formation of the top source/drain plug 122.

The gate cap layer 410 is made of a material having an etch selectivity with the source/drain cap layer 130, the bottom dielectric layer 101 and the top dielectric layer 500, which is thereby beneficial to ensuring that the gate cap layer 410 can protect the gate structure 400. In this example, the material of the gate cap layer 410 includes one or more of silicon nitride, silicon carbide, silicon carbonitride, silicon oxycarbonitride, silicon oxynitride, boron nitride and boron carbonitride. In an example, the material of the gate cap layer 410 is silicon nitride.

In this example, the top surfaces of the gate cap layer 410 and the bottom dielectric layer 101 are flush with each other.

In this example, the semiconductor structure further includes: a sacrificial dielectric layer 101 (as shown in FIG. 10), located on the substrate 100 in the isolation area 100*a* (as shown in FIG. 5). A top of the sacrificial dielectric layer 101 is flush with a top of the source/drain plug 180.

FIG. 16 is a sectional view of the device area 100*b*, which thereby does not show the bottom dielectric layer 101 located in the isolation area 100*a*. Specifically, the sacrificial dielectric layer 140 is located on the bottom dielectric layer 101. The sacrificial dielectric layer 140 is used for providing a process basis for the formation of the top source/drain plug 122 and the gate plug 170.

A material of the sacrificial dielectric layer 140 is an insulating material. Moreover, during the formation of the semiconductor structure, the bottom dielectric layer 101 is etched so as to provide a space position for the formation of the top dielectric layer 500. Therefore, the sacrificial dielectric layer 140 should be made of an easily etchable material. The material of the sacrificial dielectric layer 140 includes one or more of silicon oxide, silicon nitride, silicon carbide, silicon oxynitride, boron nitride, aluminum oxide and aluminum nitride. In this example, the material of the sacrificial dielectric layer 140 is silicon oxide.

Accordingly, in this example, the top dielectric layer 500 is located in the device area 100. Therefore, during the formation of the semiconductor structure, by only removing the sacrificial dielectric layer 140 in the device area 100*b*, the effect on the isolation area 100*a* (as shown in FIG. 5) is reduced.

In this example, the top dielectric layer 500 fills between the source/drain plug 180 and the gate plug 170. Specifically, the top dielectric layer 500 further fills the gap 190, and is located on the top dielectric layer 500 in the gap 190 to serve as a spacer 510.

The material of the top dielectric layer 500 includes a low k dielectric material or an ultra-low k dielectric material, so that the material of the spacer 510 has a low dielectric constant, thereby reducing the effective capacitance between the gate structure 400 and the source/drain plug 180 (specifically, the bottom source/drain plug 120), and further improving the performance of the semiconductor structure. Moreover, in this example, the semiconductor structure adopts a contact over active gate (COAG) process. The distance between the gate plug 170 and the source/drain plug 180 is correspondingly small, and the top dielectric layer 500 fills between the source/drain plugs 180. Therefore, the use of the top dielectric layer 500 whose material has a low dielectric constant is also beneficial to reducing the parasitic capacitance between the gate plug 170 and the source/drain plug 180. Besides, the use of the top dielectric layer 500 whose material has a low dielectric constant can also reduce RC delay of the interconnect structure in the integrated circuit.

In other examples, when the gap has a large aspect ratio, the top dielectric layer seals the top of the gap to form an air gap. The air has a low dielectric constant, and accordingly can reduce the effective capacitance between the gate structure and the source/drain plug.

In this example, the top dielectric layer 500 covers the top of the source/drain plug 180. The subsequent process further includes: a metal line electrically connecting the source/drain plugs 180 is formed on the top of the source/drain plug 180. The metal line is formed in an inter metal dielectric layer. By making the top dielectric layer 500 cover the top of the source/drain plug 180, the top dielectric layer 500 higher than the top of the source/drain plug 180 serves as the inter metal dielectric layer, thereby simplifying the process steps of the BEOL. In other examples, the top of the top dielectric layer is flush with the top of the source/drain plug, or the top of the top dielectric layer is lower than the top of the source/drain plug, so that the material of the inter metal dielectric layer can be selected flexibly to meet the performance requirements of the semiconductor structure.

The semiconductor structure may be formed by using the forming method described in the foregoing example, or may be formed by using other forming methods. For the specific description of the semiconductor structure of this example, reference may be made to the corresponding description in the foregoing example, and details will not be repeated here in this example.

Although the disclosure is disclosed above, the disclosure is not limited thereto. A person skilled in the art can make various changes and modifications without departing from the spirit and the scope of the disclosure. Therefore, the protection scope of the disclosure should be subject to the scope defined by the claims.

What is claimed is:

1. A semiconductor structure, comprising:

a substrate;

a gate structure, located on the substrate;

a source/drain doped area, located in the substrate on two sides of the gate structure;

a contact etch stop layer, located on the substrate between the source/drain doped area and the gate structure and arranged opposite to a side wall of the gate structure, a gap being provided between the contact etch stop layer and the side wall of the gate structure;

a source/drain plug, located at a top of the source/drain doped area and contacting the source/drain doped area; and a top dielectric layer, filling between the source/drain plugs, the top dielectric layer further filling the gap and the top dielectric layer filling the gap serving as a spacer, or the top dielectric layer sealing a top of the gap to form an air gap, and a material of the top dielectric layer being a low k dielectric material or an ultra-low k dielectric material;

a bottom dielectric layer, located on the substrate at a side of the gate structure, the bottom dielectric layer covering the source/drain doped area, wherein the source/drain plug comprises:

a bottom source/drain plug, running through the bottom dielectric layer above the source/drain doped area and contacting the source/drain doped area; and a top source/drain plug, located on the bottom source/drain plug and contacting the bottom source/drain plug;

a source/drain cap layer, located between a top of the bottom source/drain plug and the top dielectric layer;

a gate plug, located at a top of the gate structure and contacting the gate structure; and a gate cap layer, located between the top of the gate structure and the top dielectric layer, wherein the top dielectric layer fills between the source/drain plug and the gate plug.

2. The semiconductor structure according to claim 1, wherein the semiconductor structure further comprises: an anti-diffusion layer, located on a side wall of the contact etch stop layer exposed by the gap.

3. The semiconductor structure according to claim 2, wherein a material of the anti-diffusion layer comprises at least one of silicon nitride, silicon carbide, silicon carbonitride, silicon oxycarbonitride, silicon oxynitride, boron nitride, boron carbonitride, aluminum oxide, or aluminum nitride.

4. The semiconductor structure according to claim 2, wherein a thickness of the anti-diffusion layer is less than or equal to 30 Å.

5. The semiconductor structure according to claim 4, wherein the thickness of the anti-diffusion layer is 5 Å to 15 Å.

6. The semiconductor structure according to claim 1, wherein the substrate comprises a device area and an isolation area, the gate structure, the source/drain doped area and the top dielectric layer are all located in the device area, and the semiconductor structure further comprises:

a sacrificial dielectric layer, located on the substrate in the isolation area, a top of the sacrificial dielectric layer being flush with a top of the source/drain plug.

7. The semiconductor structure according to claim 1, wherein the top dielectric layer covers a top of the source/drain plug, a top of the top dielectric layer is flush with the top of the source/drain plug, or the top of the top dielectric layer is lower than the top of the source/drain plug.

8. The semiconductor structure according to claim 1, wherein in a direction parallel to a surface of the substrate and perpendicular to the side wall of the gate structure, a width of the gap is 2 nm to 12 nm.

9. The semiconductor structure according to claim 1, wherein a material of the contact etch stop layer is a low k dielectric material, an ultra-low k dielectric material or silicon nitride.

* * * * *